United States Patent
Davis et al.

(10) Patent No.: US 6,850,743 B2
(45) Date of Patent: Feb. 1, 2005

(54) RADIO HAVING ADAPTABLE SEEK SENSITIVITY CONTROL AND METHOD THEREFOR

(75) Inventors: J. Roger Davis, Russiaville, IN (US); David Arlan Copp, Sharpsville, IN (US)

(73) Assignee: Delphi Technologies, Inc., Troy, MI (US)

(*) Notice: Subject to any disclaimer, the term of this patent is extended or adjusted under 35 U.S.C. 154(b) by 784 days.

(21) Appl. No.: 09/730,110

(22) Filed: Dec. 5, 2000

(65) Prior Publication Data

US 2002/0068535 A1 Jun. 6, 2002

(51) Int. Cl.[7] .............................. H04B 1/18; H04Q 7/20
(52) U.S. Cl. .............................. 455/161.1; 455/161.2; 455/161.3; 455/177.1; 455/184.1; 455/231; 455/456.3
(58) Field of Search .......................... 455/160.1, 161.1, 455/161.2, 161.3, 173.1, 174.1, 177.1, 184.1, 226.1, 226.2, 230, 231, 254, 456.1, 456.3, 456.5, 67.11, 150.1, 154.1, 154.2, 155.1, 156.1, 157.1, 178.1, 182.2, 226.3, 48, 220, 463.3

(56) References Cited

U.S. PATENT DOCUMENTS

| | | | | |
|---|---|---|---|---|
| 5,152,012 A | * | 9/1992 | Schwob | 455/158.5 |
| 6,021,320 A | | 2/2000 | Bickford et al. | 455/186.1 |
| 6,289,207 B1 | * | 9/2001 | Hudecek et al. | 455/150.1 |
| 6,295,444 B1 | * | 9/2001 | Morande et al. | 455/218 |
| 6,526,268 B1 | * | 2/2003 | Marrah et al. | 455/186.1 |

* cited by examiner

*Primary Examiner*—Duc M. Nguyen
(74) *Attorney, Agent, or Firm*—Stefan V. Chmielewski

(57) ABSTRACT

A tuneable radio and method for automatically adjusting the seek sensitivity alignment for seek operations. The radio has a radio receiver for receiving broadcast radio wave signals, and a tuner adjustable for selecting from a plurality of radio wave signal channels. A detector detects signal strength of the received radio wave signals, and a seek input allows a user to initiate a seek operation to select a signal channel having a signal strength exceeding a seek sensitivity threshold. A controller calculates an average signal value and adjusts the seek sensitivity threshold based on the average value. The controller adjusts the seek sensitivity when it is determined that the radio has travelled beyond a minimum distance.

31 Claims, 9 Drawing Sheets

RADIO HAVING ADAPTABLE SEEK SENSITIVITY CONTROL AND METHOD THEREFOR

CROSS-REFERENCE TO RELATED APPLICATION

This application is one of two applications filed on the same date, both commonly assigned and having similar specifications and drawings, the other application being identified as U.S. application Ser. No. 09/730,111, entitled "RADIO HAVING ADJUSTABLE SEEK SENSITIVITY BASED ON AVERAGE SIGNAL STRENGTH AND METHOD THEREFOR."

TECHNICAL FIELD

The present invention generally relates to electronic radios and, more particularly, to a mobile tuneable radio, such as a car audio radio, having a signal channel seek operation for tuning to signal channels having sufficient signal strength.

BACKGROUND OF THE INVENTION

Automotive vehicles are commonly equipped with an AM/FM radio for providing audio entertainment for the passenger(s) in the vehicle. Audio car radios are typically packaged with playback devices such as compact disc (CD) and/or tape cassette players, as well as other audio entertainment devices. AM/FM radios include AM and FM receivers for receiving amplitude modulated (AM) and frequency modulated (FM) signals, respectively. Also included is a tuner for adjustably selecting amongst a plurality of radio wave signal channels that are generally available on the commercial airwaves. Many AM/FM radios are programmable to set desired radio wave channels (frequencies), so that a user may select a preset channel. In addition, conventional AM/FM radios are commonly equipped with channel seek and scan operations which enables the radio to successively search out those available radio wave channels meeting a minimal signal strength requirement.

The radio seek operation is performed when a user depresses a seek pushbutton. In response to depressing the seek pushbutton, the radio scans each successive signal channel, in increasing or decreasing order of the frequency bandwidth, and selects the next received signal channel having a signal strength greater than a seek sensitivity threshold. Each depression of the seek pushbutton will tune to the next received signal channel having a signal strength exceeding the seek sensitivity threshold. The scan operation automatically repeats the seek function at set time intervals. The seek sensitivity threshold is commonly fixed by the manufacturer of the radio during a one-time seek sensitivity alignment procedure.

Automotive radios employing the fixed seek sensitivity threshold may be well suited for some users. However, a fixed seek sensitivity threshold has several drawbacks in that, as the vehicle moves into different geographic regions, the available number of signal channels and the strength of the radio wave signals may change. The signal strength of radio wave signals can change dramatically, and some stations may disappear altogether, while other stations become available. This is especially true when the geographic position of the radio receiver changes in excess of fifty miles. Further, the fixed seek sensitivity threshold may not be adequate for use in certain geographic regions, in which the vehicle be employed. For example, a seek sensitivity threshold that is sufficient for use in urban regions may be insufficient for use in rural regions where the threshold value may result in the reception of too few stations during a seek operation. Contrarily, a lower seek sensitivity threshold that is sufficient for use in rural regions with fewer available stations may result in the selection of too many signal channels when used in an urban region.

The decision as to what level of signal strength is listenable is subjective, and may vary based on the concentration of receivable radio station signals available within the region of use. In areas of few radio stations, listeners may accept a lower seek sensitivity threshold, and thus noisier signals, than listeners located in a region with a higher number of radio stations. Accordingly, it is therefore desirable to provide for a tuneable automotive radio that provides a seek operation to enable a user to select an adequate number of signal channels.

SUMMARY OF THE INVENTION

In accordance with the teachings of the present invention, a tuneable radio and method are provided for automatically adjusting the seek sensitivity alignment of the radio for seek operations. The radio has a receiver for receiving broadcast radio wave signals, a tuner adjustable for selecting from a plurality of radio wave signal channels, and a detector for detecting signal strength of the received radio wave signals. The radio has a seek input for initiating a seek operation to seek a radio wave signal channel having a signal strength greater than a seek sensitivity threshold. The radio also has a controller for receiving the detected signal strength of the received radio wave signals and adjusting the seek sensitivity threshold value based on the signal strength.

According to the method of the present invention, the method includes the steps of receiving broadcast radio wave signals, providing a tuner adjustable for selecting from a plurality of radio wave signal channels, and detecting signal strength for each of the received broadcast radio wave signals. The method adjusts a seek sensitivity value based on the signal strength.

Accordingly, the seek sensitivity of the radio is automatically adjusted so as to provide for enhanced radio station reception for users, particularly for use in automotive vehicles that travel long distances. The radio advantageously allows for seek sensitivity adjustment such that an increased threshold is employed in regions having higher concentrations of available stations so as to reduce the number of signal channels that are selected, while a decreased threshold is employed in regions having lower concentrations of available stations so as to increase the number of signal channels that are selected.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
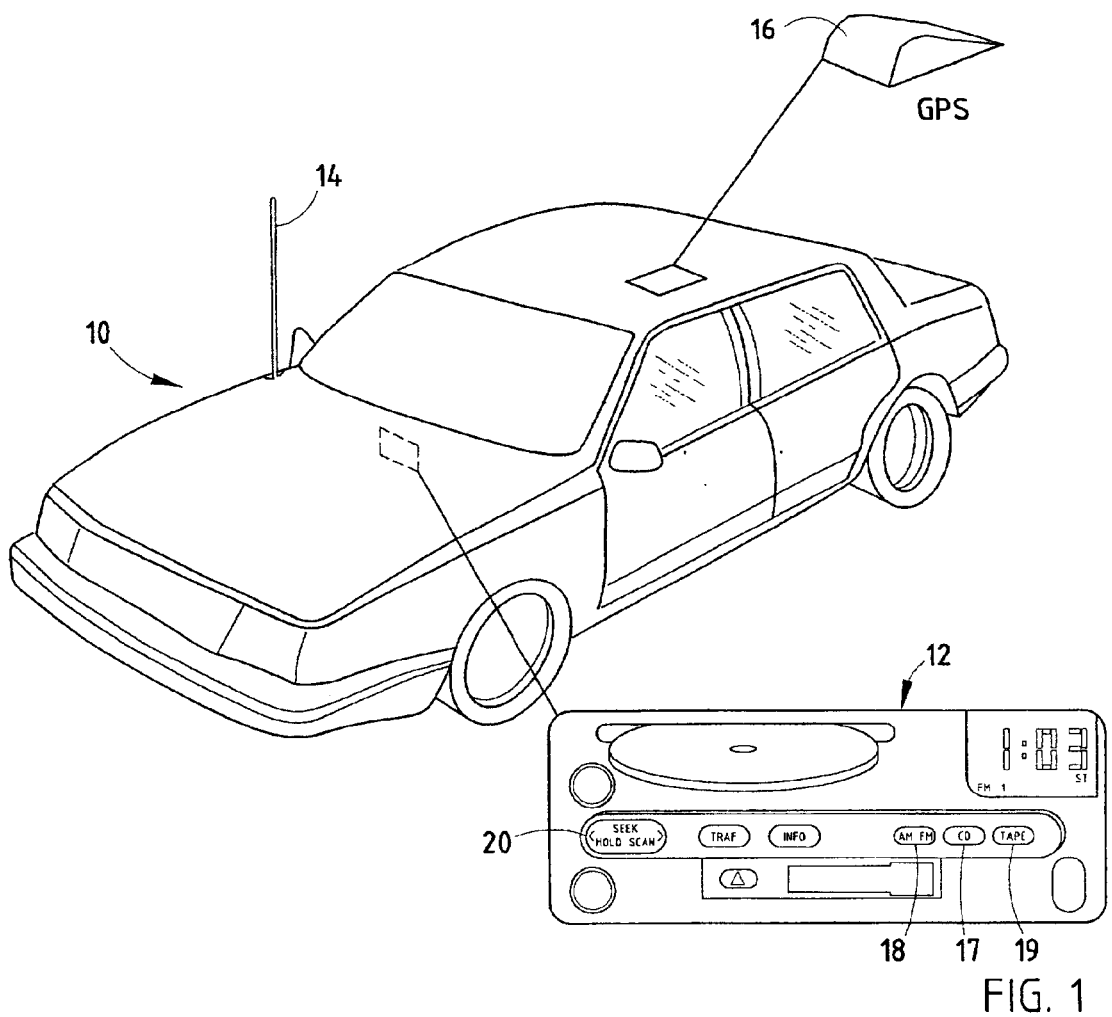
FIG. 1 is a perspective view of an automotive vehicle equipped with a tuneable AM/FM radio.

Referring to FIG. 1, an automotive vehicle 10 is shown equipped with an AM/FM radio 12 which is configured to perform a radio channel seek operation with adjustable seek sensitivity alignment, according to the present invention. According to the embodiment shown, the radio 12 is an AM/FM audio car radio equipped to provide reception of AM and FM radio wave signals available in the coverage region. While the radio is described herein as an audio car radio, it should be appreciated that the radio may be employed as a separate stand alone electronic device, such as a portable handheld radio, and may be used in various other applications, without departing from the teachings of the present invention.

The audio car radio 12 may be mounted on the dash of the vehicle 10 according to a conventional car radio installation. The car radio 12 shown is an AM/FM radio equipped with audio playback devices, including an audio tape player and a compact disc (CD) player. Extending from the radio face plate is a human-machine interface (HMI) key matrix with a plurality of manually operable controls. Included in the manual controls is an "AM/FM" pushbutton switch 18 for selecting either of the amplitude modulation (AM) signal band and the frequency modulation (FM) signal band. The manual controls further include a "SEEK" pushbutton switch 20 that is manually depressible to initiate a radio channel seek operation according to the present invention. The "SEEK" pushbutton switch 20 performs a seek operation when momentarily depressed, and further activates the scan operation when continuously depressed for an extended time period, such as two seconds. Also included in the controls are pushbutton switches 17 and 19 for selecting the audio tape player and CD player, respectively. The manual controls are easily accessible by the driver or passenger(s) in the vehicle 10.

The vehicle 10 is further shown equipped with a radio antenna 14 for receiving broadcast radio wave signals. Radio antenna 14 is capable of receiving AM and/or FM broadcast radio wave signals. Further, a global positioning system (GPS) receiver/antenna 16 is shown mounted on the roof of the vehicle 10, and is exposed to GPS radio wave signals.

Figure 2:
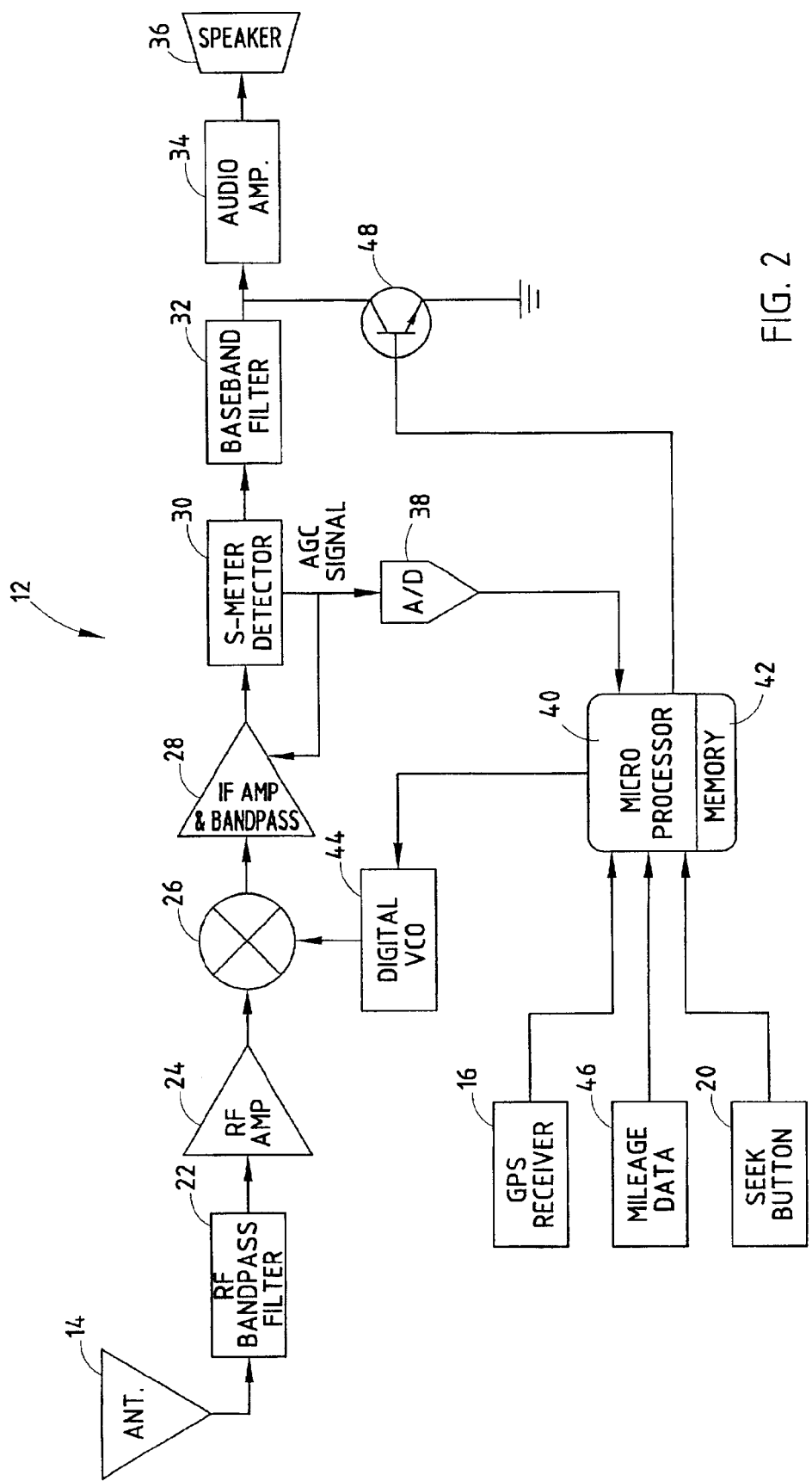
FIG. 2 is a block diagram of the tuneable radio, according to one embodiment of the present invention.

Referring to FIG. 2, the AM/FM audio car radio 12 is shown having an RF bandpass filter 22 connected to antenna 14 for passing received radio wave signals in the AM and FM frequency bandwidths, and rejecting other signals. The antenna 14 and RF bandpass filter 22 operates as a receiver to receive radio wave signals. The audio car radio 12 also contains an RF amplifier 24, a mixer 26, an intermediate frequency (IF) amplifier and bandpass filter 28, and an S-meter signal detector 30. The S-meter signal detector 30 senses the signal strength amplitude of the radio wave signals of each tuned signal channel and generates an automatic gain control (AGC) signal in response thereto. The AGC signal is input as a feedback to the IF amplifier and bandpass filter 28, and is also input to an analog-to-digital converter 38. The output of the analog-to-digital converter 38, in turn, is input to a microprocessor 40. The microprocessor 40 generates an output signal which is input to a digital voltage controlled oscillator (VCO) 44, which, in turn, provides an input to the mixer 26 to tune the radio 12 to one of a plurality of available radio frequency signal channels. Together, the mixer 26, digital VCO 44, microprocessor 40, detector 32, A/D converter 38, and IF amplitude bandpass filter 28 provide an AM/FM radio tuner for tuning to selected radio frequency signal channels.

The microprocessor 40 receives input signals from the GPS receiver 16, a mileage data (vehicle computer) signal 46, and a control signal from the seek pushbutton 20. The microprocessor 40 stores the inputs in memory 42. Memory 42 also stores routines for controlling radio operations including various routines for controlling seek sensitivity threshold adjustments, according to the present invention. According to one embodiment of the present invention, the microcontroller 40 determines when to update the seek sensitivity threshold based on distance travelled as determined by the GPS receiver 16. According to another embodiment, the microprocessor 40 determines when to update the seek sensitivity threshold based on mileage data signal 46 and an elapsed time period of vehicle travel. According to another aspect of the present invention, the microprocessor 40 adjusts the seek sensitivity threshold based on a determined average signal strength of received signals.

The radio 12 further includes a baseband filter 32 and an audio amplifier 34 for generating an output audio signal. In addition, a transistor 48, in response to a control signal from the microprocessor 40, provides mute control to mute the audio output. The radio 12 is connected to one or more audio speakers 36 as is well-known for generating audio sound in response to output signal 34.

According to well-known GPS operations, the GPS receiver 16 receives GPS radio wave signals via a GPS receiving antenna. The GPS radio wave signals are emitted from existing GPS satellites. A constellation of multiple high altitude GPS satellites currently exist in Earth orbit and are available to provide continuous worldwide position (location) fixes in all types of weather conditions. The GPS receiver 16 may include a conventional built-in processing unit and memory for processing the GPS radio wave signals to determine the latitude and longitude position coordinates of the current location, as well as determining the current direction of travel and speed of the vehicle.

More specifically, the GPS receiver 16 continuously receives radio wave signals from the GPS antenna and determines accurate position coordinates which identify the location of the received signals. This determination includes calculating the distance from various satellites to determine a location relative thereto. By measuring the current signals sent by the GPS satellites and knowing orbital parameters of the satellites, the GPS receiver is able to determine the location thereof and generate longitude and latitude position coordinates which identify the location of the received signals. Given the received GPS signals, the latitude and longitude position coordinates of the GPS receiver are determined by computing distance from each of several GPS satellites currently visible to the receiver 16 by direct line-of-sight. Distance is determined by precise computation of the time required for radio signals to travel from the GPS satellite to the GPS receiver 16. Combined with precise information about the satellites' locations relative to the Earth, precise latitude and longitude position coordinates are computed. GPS is widely known and should be understood to those skilled in the art as a means for providing accurate location information. Further, it should be appreciated that other forms of location determining devices, other than GPS, could be employed now and in the future to provide location information.

Figure 3:
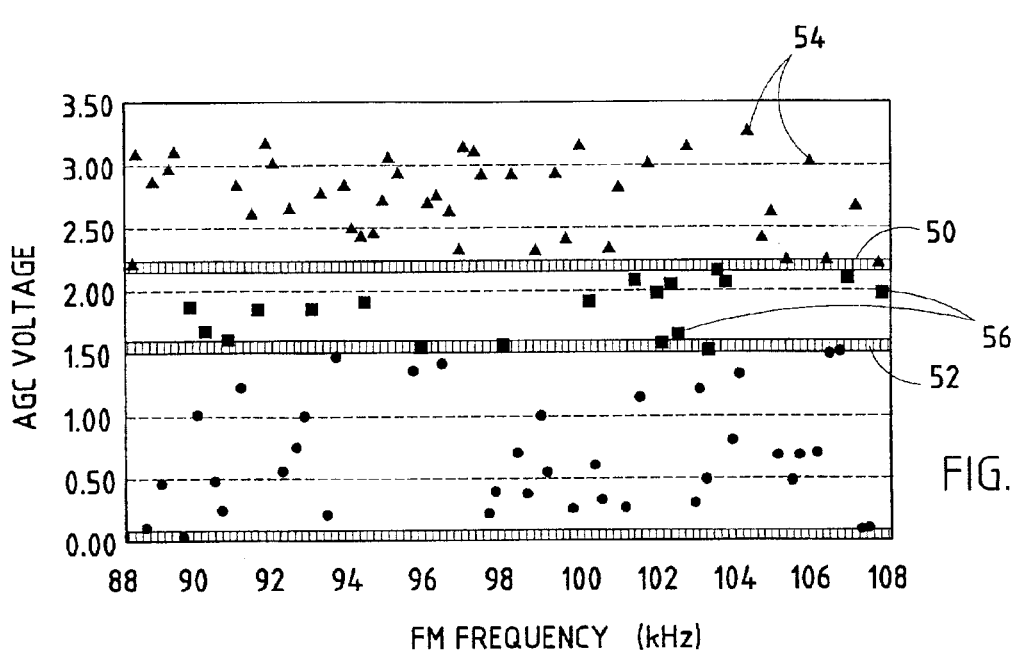
FIG. 3 is a graph illustrating automatic gain control (AGC) signals received with the radio and compared with an adjustable seek sensitivity threshold for an FM radio wave bandwidth.

Referring to FIG. 3, one example of AGC voltage signal strength values measured at various radio wave signal channels in the FM frequency bandwidth is illustrated therein. A first seek sensitivity threshold is shown by line 52 which, according to one embodiment, may be set at the factory by the radio or vehicle manufacturer. It should be appreciated that the present invention advantageously adjusts the seek sensitivity threshold to a new seek sensitivity threshold, such as line 50, in accordance with the present invention. With the seek sensitivity threshold set at line 50, only those radio wave signal channels above line 50, as indicated by signals 54, will be detected during a seek operation, as well as during a scan operation. Those channels having signal strength values below the seek sensitivity threshold 50, identified as signals 56, will be ignored during a seek or scan operation. It should be appreciated that the present invention adjusts the seek sensitivity threshold so as to limit the number of signal channels detected in regions having a large number of available radio station channels, and may be lowered to select an increased number of signal channels in regions having a lower number of available radio station channels.

Figure 8:
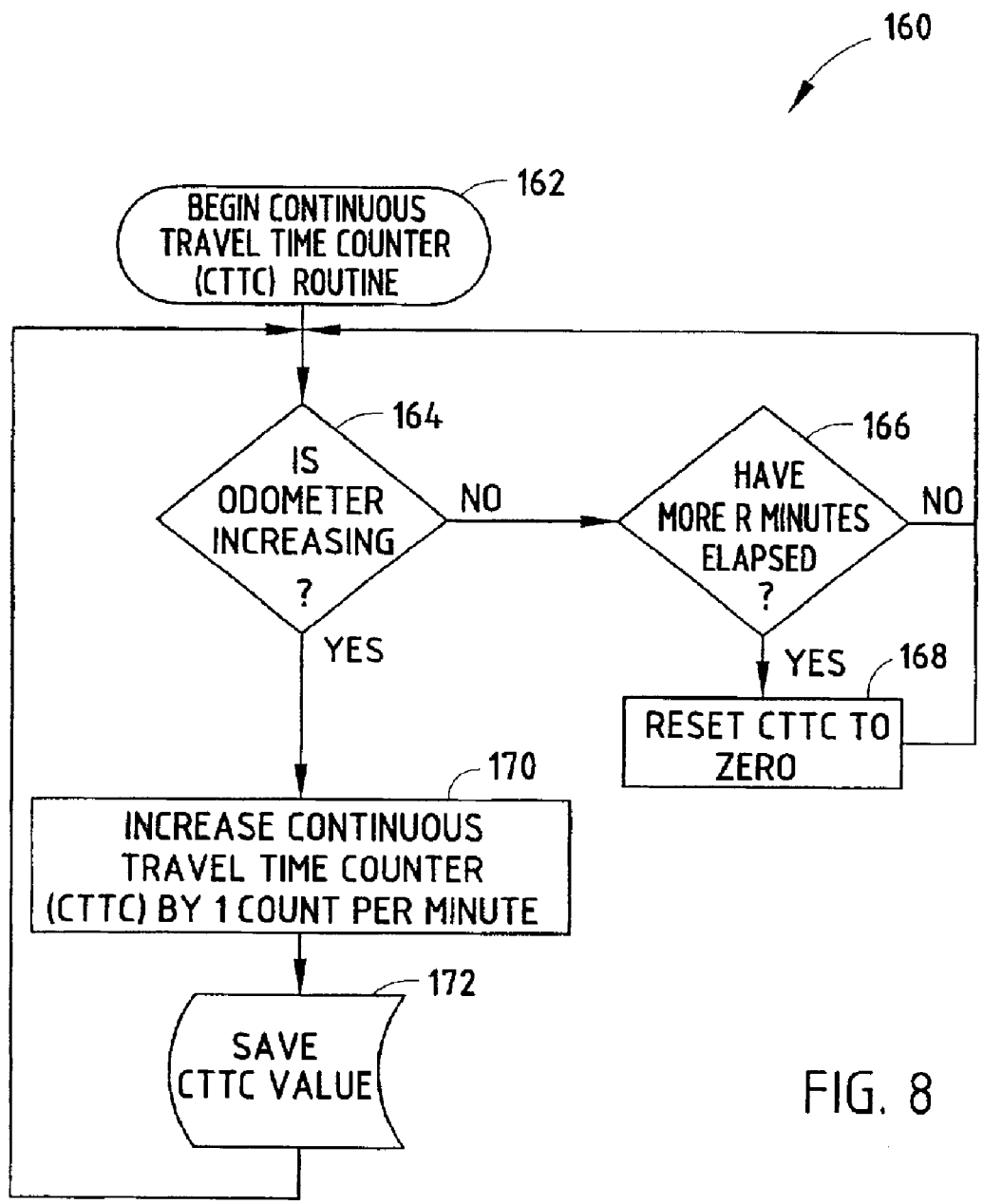
FIG. 8 is a flow diagram illustrating a subroutine for computing the continuous travel time count for use in the routine of FIG. 7.
Figure 9:
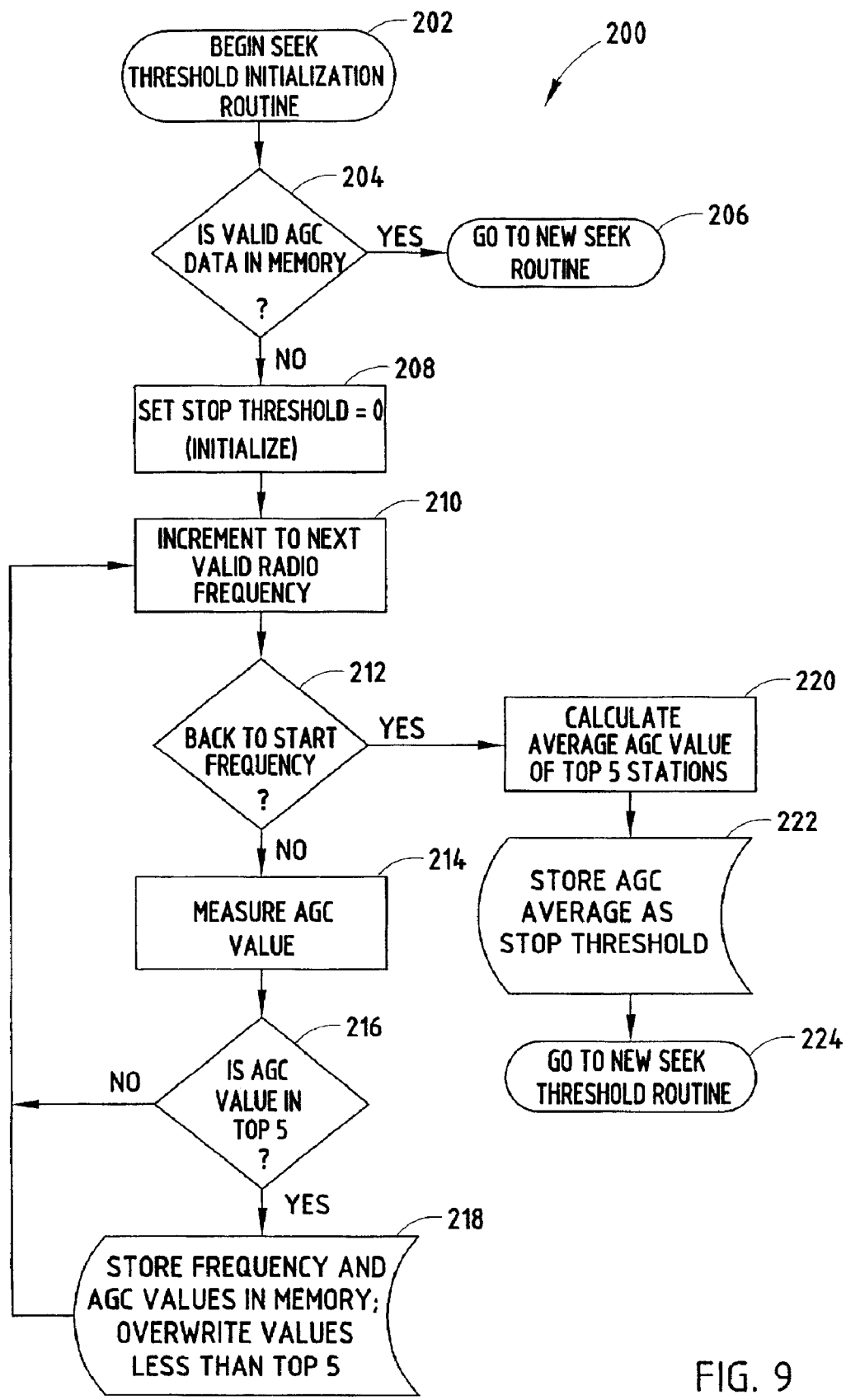
FIG. 9 is a flow diagram illustrating an initalization routine for determining the initial seek sensitivity threshold.
Figure 10A:
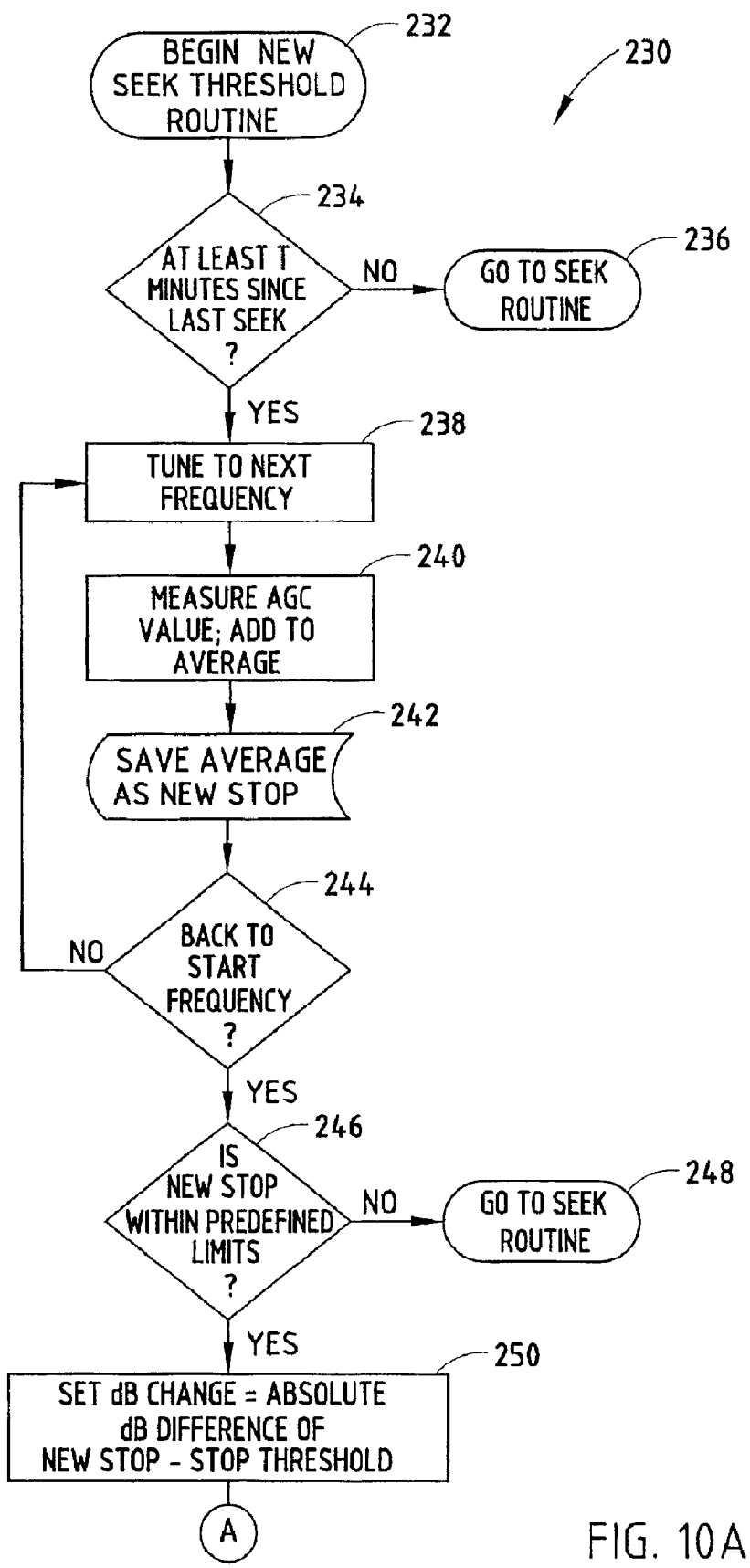
FIGS. 10A and 10B are flow diagrams illustrating a routine for adjusting the seek sensitivity threshold in accordance with the present invention.
Figure 10B:
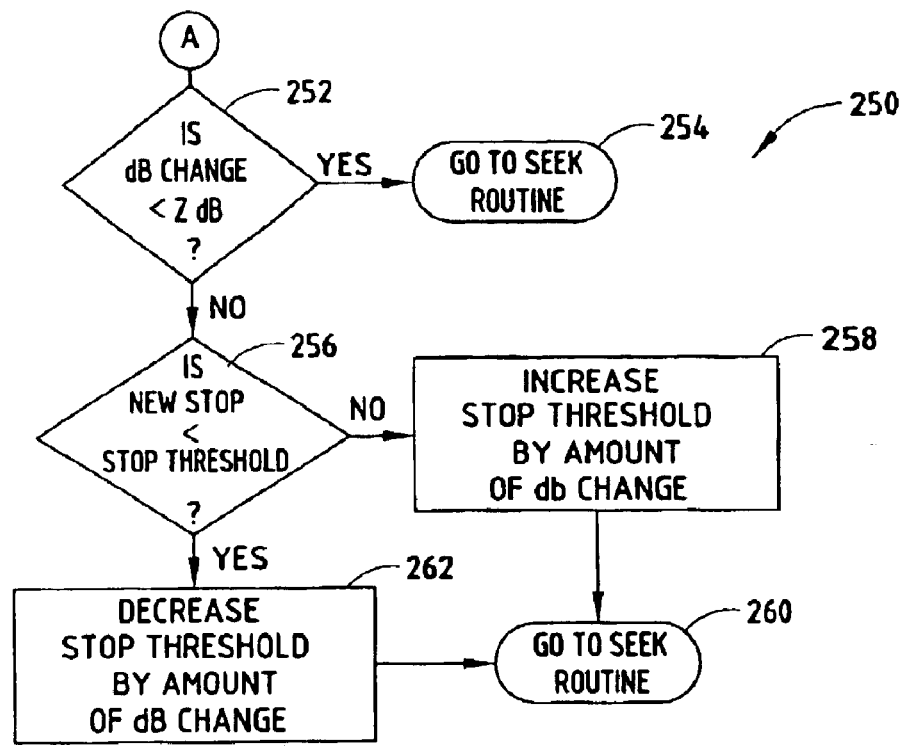
Figure 11:
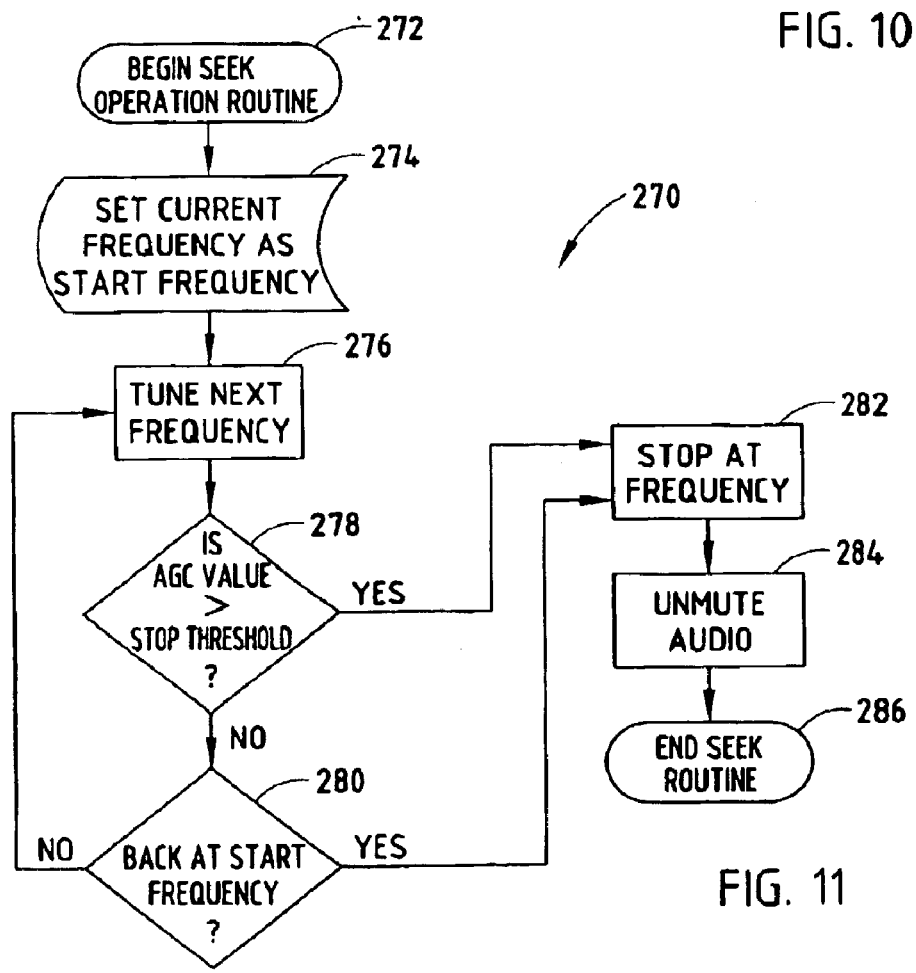
FIG. 11 is a flow diagram illustrating a routine for performing a seek operation using the adjustable seek sensitivity threshold of the present invention.

The control routines for adjusting the seek sensitivity threshold and performing a seek operation according to the present invention are generally illustrated in FIGS. 4–11. More particularly, the routines shown in FIGS. 4–8 determine when a seek sensitivity threshold adjustment may be made based on a GPS measured travel distance or an estimated travel distance of the vehicle. The routines shown in FIGS. 9–11 provide an adjustment of the seek sensitivity threshold based on an average signal strength of the received radio wave signals.

Figure 4:
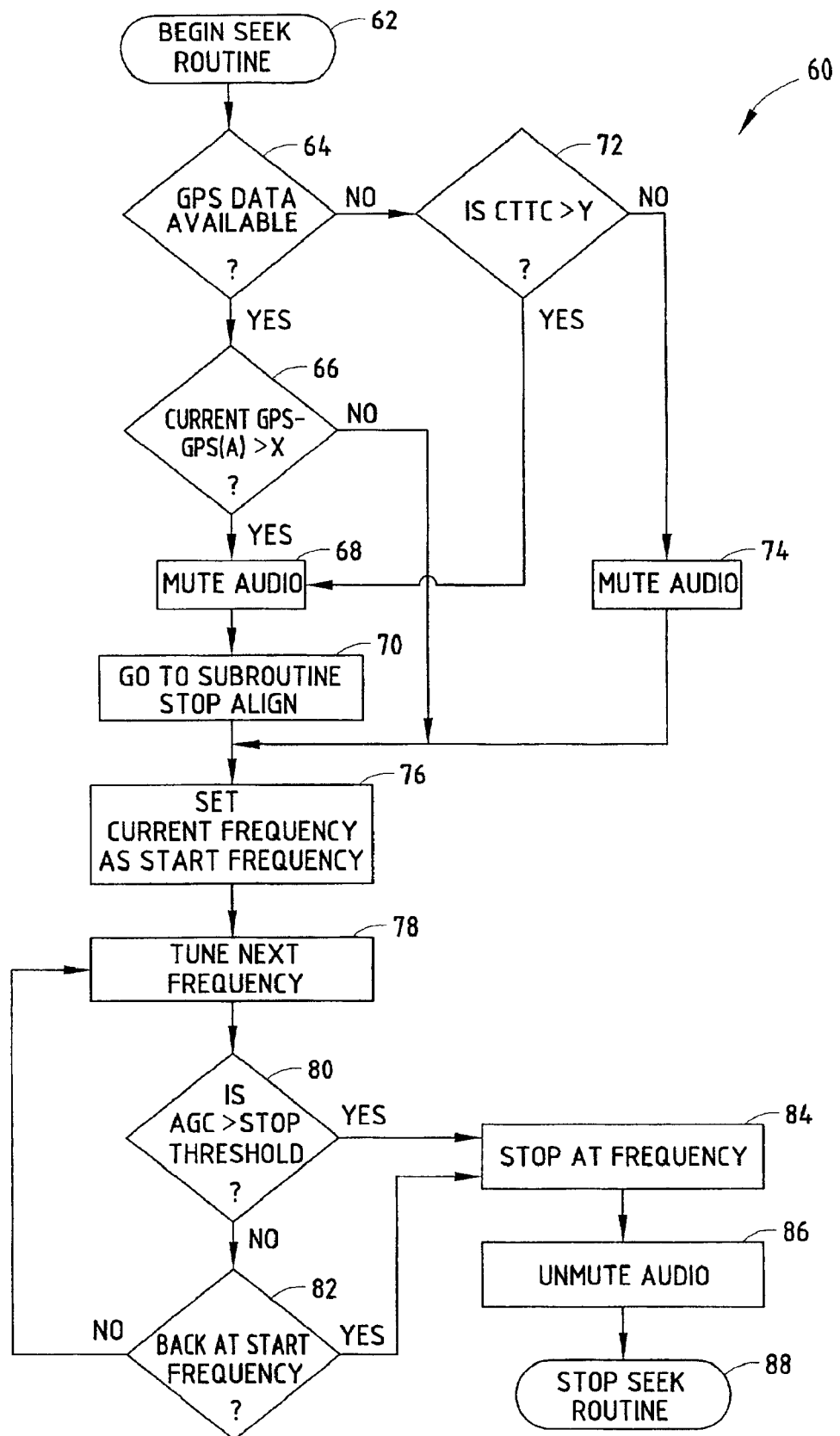
FIG. 4 is a flow diagram illustrating a routine for setting the seek sensitivity threshold and performing a seek operation with the radio.

Referring to FIG. 4, a seek routine 60 is illustrated therein for determining whether to perform a seek sensitivity alignment procedure to adjust the seek sensitivity threshold, and further for selecting a signal channel during a seek operation. Routine 60 begins at step 62 and proceeds to decision step 64 to check if GPS data is available. If GPS data is available, routine 60 proceeds to decision step 66 to determine if the current GPS determined location (i.e., position) deviates from the last GPS location GPS (A) in excess of an amount X and, if so, proceeds to step 68 to mute the audio, and then proceeds to step 70 to jump to the stop align subroutine. The stop align subroutine, which is discussed herein in connection with FIG. 5, determines a new seek sensitivity threshold, also referred to as the stop threshold. If the current GPS determined location has not deviated from the last location GPS (A) in excess of distance X, step 66 proceeds directly to step 76. Referring back to step 64, if the GPS data is not available, routine 60 proceeds to decision step 72 to check if the continuous travel time counter (CTTC) is greater than a time count value Y and, if so, proceeds to step 68 to mute the audio, and thereafter proceeds to step 70 to jump to the stop align subroutine. If the continuous travel time counter is not greater than time count Y, routine 60 proceeds to step 74 to mute the audio output and then proceeds to step 76. It should be appreciated that the continuous travel time counter is an alternate means to estimate if the vehicle may have travelled a great enough distance such that it would be advantageous to readjust the seek sensitivity threshold.

In step 76, the seek routine 60 sets the current radio frequency as the start frequency, and then proceeds to step 78 to tune to the next frequency. Next, decision step 80 determines if the automatic gain control signal is greater than the stop threshold, (i.e., seek sensitivity threshold). If the automatic gain control signal is not greater than the stop threshold, routine 60 proceeds to decision step 82 to determine if the current frequency has returned to the start frequency and, if not, returns to step 78. If the automatic gain control signal is greater than the stop threshold, or if the current frequency has returned to the start frequency, seek routine 60 proceeds to stop at the current frequency in step 84. Accordingly, a radio channel is selected in step 84. Once the radio channel is selected, the audio output is unmuted in step 86 and, the seek routine is stopped in step 88.

Figure 5:
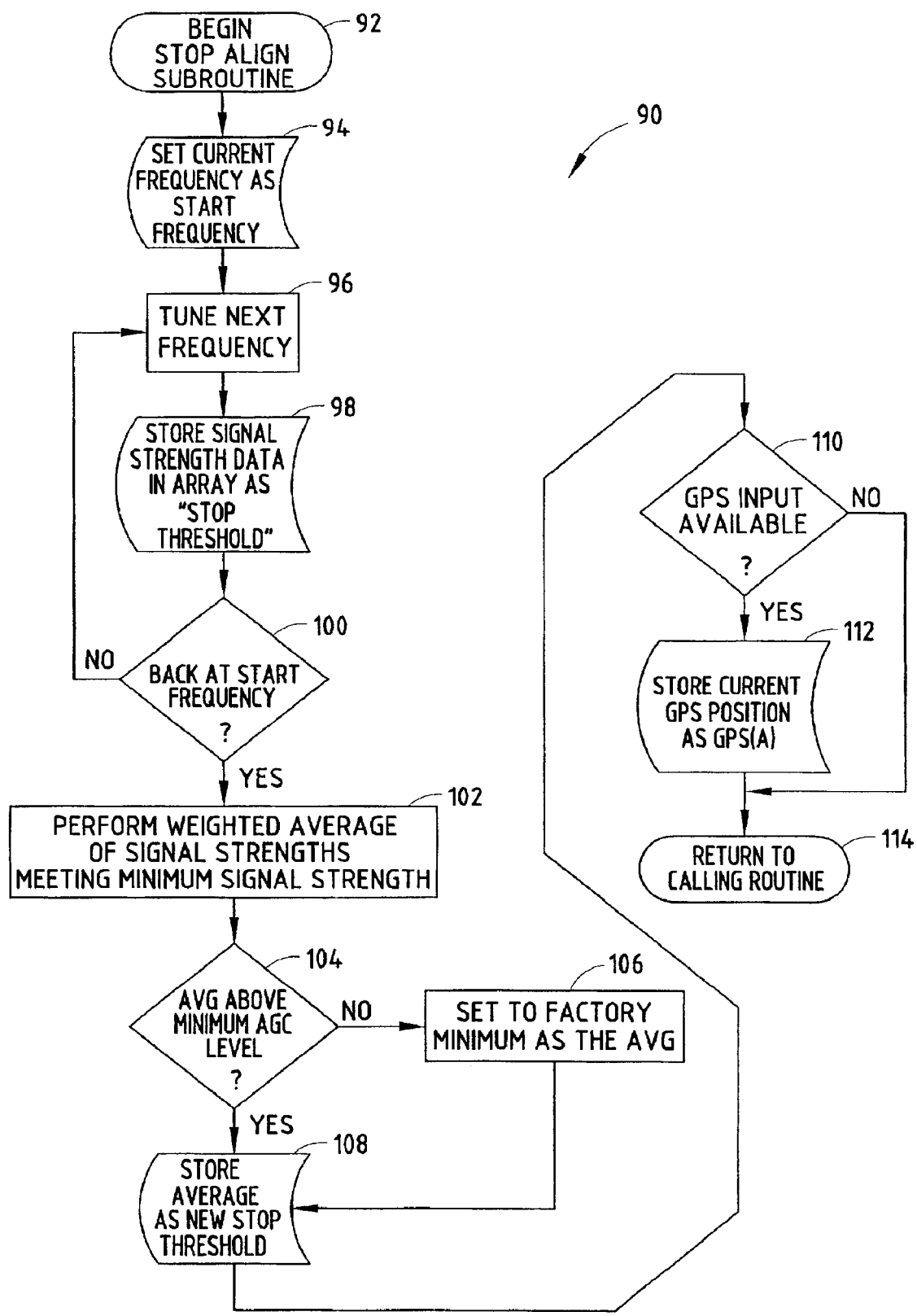
FIG. 5 is a flow diagram illustrating a subroutine for adjusting the seek sensitivity threshold.

The stop align subroutine 90 is illustrated in FIG. 5. Subroutine 90 begins at step 92, and proceeds to step 94 to set the current frequency as the start frequency. Next, in step 96 the radio is tuned to the next successive frequency (channel) and then the measured signal strength data is stored in an array as the stop threshold. In decision step 100, subroutine 90 determines if the current frequency has returned to the start frequency and, if not, returns to step 96. Otherwise, subroutine 90 proceeds to step 102 to perform a weighted average of the signal strength value meeting a minimum signal strength level. It should be appreciated that a weighted average value is preferably determined based on only signals meeting the minimum signal strength level, such as a minimum factory setting. Once the weighted average value is determined, decision step 104 determines if the average value is above a minimum AGC level. If the average value is not above the minimum AGC level, the average value is set equal to the factory minimum in step 106, and is then stored as the new stop threshold in step 108. Otherwise, if the average value is above the minimum AGC level, the average value is stored as the new stop threshold in step 108.

Once the stop threshold value has been determined, subroutine 90 proceeds to decision step 110 to determine if a GPS input is available and, if not, proceeds to step 114 to return to the calling routine. If GPS input data is available, subroutine 90 proceeds to step 112 to store the current GPS location as GPS (A), and then returns to the calling routine in step 114. Accordingly, subroutine 90 determines a weighted average value and automatically adjusts the seek sensitivity threshold based on a weighted average value.

Figures 6, 7:
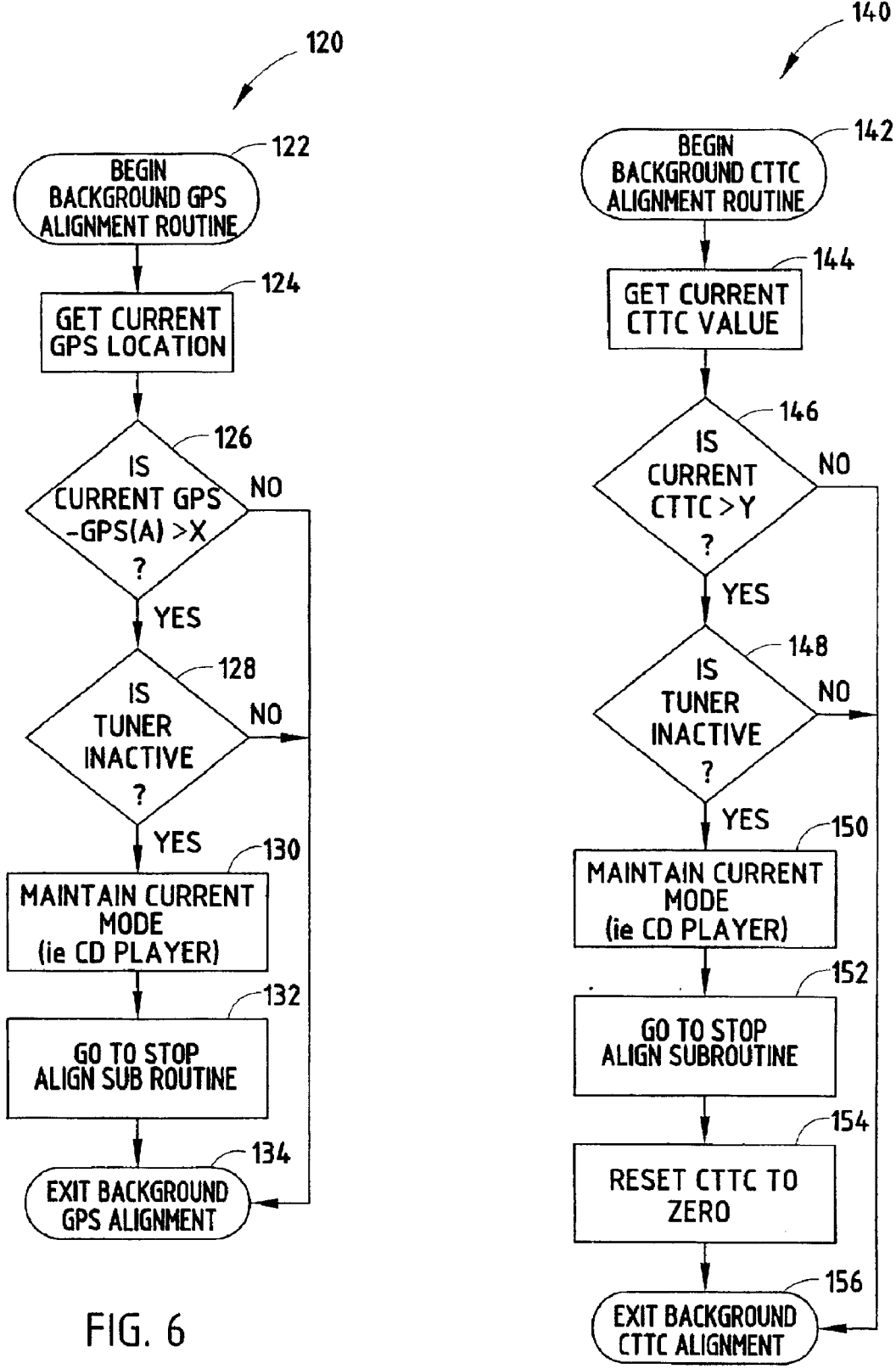
FIG. 6 is a flow diagram illustrating a routine for setting the seek sensitivity threshold based on GPS position signal information.
FIG. 7 is a flow diagram illustrating a routine for setting the seek sensitivity threshold based on a continuous travel time count.

Referring to FIG. 6, a background GPS alignment routine 120 is illustrated therein. Routine 120 begins at step 122 and proceeds to get the current GPS location in step 124. Next, in decision step 126, routine 120 determines if the current GPS location deviates from the last stored GPS location in excess of a distance X and, if not, proceeds to step 134 to exit the background GPS alignment routine. If the distance between the current GPS location and the last stored GPS location exceeds distance X, routine 120 proceeds to decision step 128 to determine if the tuner is inactive. If the tuner is active (i.e., on), routine 134 exits in step 134. If the tuner is inactive (i.e., off), routine 120 proceeds to step 130 to maintain the current mode of the radio, such as the CD player or the tape player, for example. Thereafter, in step 132, routine 120 jumps to the stop alignment subroutine to determine a new seek sensitivity threshold, and then exits the background GPS alignment routine in step 134. Accordingly, the seek sensitivity threshold is adjusted when the tuner is not active, such as when the radio is operating in a playback mode. By requiring that the tuner be inactive, the tuner can be employed to scan all signal channels to acquire the signal strength of each channel.

A background continuous travel time counter alignment routine 140 is illustrated in FIG. 7. Routine 140 begins at step 142 and proceeds to step 144 to get the current CTTC value. Next, in decision step 146, routine 140 checks to see if the current CTTC value is greater than value Y and, if not, exits the routine 140 in step 156. If the current CTTC value exceeds value Y, routine 140 proceeds to decision step 148 to determine if the tuner is inactive and, if not, exits routine 140 in step 156. If the tuner is inactive, routine 140 proceeds to step 150 to maintain the current mode of the radio, such as the CD player or the tape player, for example. Thereafter, in step 152, routine 140 goes to the step align subroutine to determine a new seek sensitivity threshold. Next, routine 140 resets the CTTC value to zero in step 150 and exits routine 140 in step 156. Accordingly, the seek sensitivity threshold is adjusted when the tuner is not active, such as when the radio is operating in a playback mode. By requiring that the tuner be inactive, the tuner can be employed to scan all signal channels to acquire the signal strength of each channel.

A continuous travel time counter routine 160 is illustrated in FIG. 8. Routine 160 begins at step 162 and proceeds to decision step 164 to check if the odometer reading is increasing. If the odometer reading is not increasing, indicating that the vehicle is not in motion, routine 160 then checks for whether R minutes have elapsed in decision step 166 and, if so, resets the CTTC value to zero in step 168, and then returns to decision step 164. If R minutes have not elapsed, routine 160 returns to step 164 without resetting the CTTC value to zero. If the odometer reading is increasing, indicative that the vehicle is moving, routine 160 proceeds to step 170 to increase the continuous travel time counter by one count increment per minute. The CTTC value is then saved in memory in step 172, and is then employed in routine 140 as described above.

Accordingly, the seek sensitivity threshold alignment of the present invention advantageously provides for an adjustable seek sensitivity threshold that may vary depending on the signal strength and number of radio station signals available. The seek sensitivity threshold is adjusted when the vehicle may have travelled a sufficient distance as determined by GPS data or odometer and time count information. The seek sensitivity threshold alignment preferably occurs when the tuner is inactive, such as when the radio is operating in a playback mode, such as the cassette player or CD player. By requiring that the tuner be in an inactive mode, the determination and adjustment of a seek sensitivity threshold does not interrupt the tuner and therefore the audio radio mode of operation. Accordingly, the seek sensitivity threshold alignment allows for a more controlled number of stations to be received during a radio seek operation.

Referring to FIG. 9, a seek threshold initialization routine 200 is shown for initially determining the seek sensitivity threshold when the vehicle is first started following a power disruption. The routine 200 begins at step 202 and proceeds to decision step 204 to determine if valid AGC data is stored in memory. If valid AGC data is stored in memory, the routine 200 assumes an initial seek sensitivity threshold is already present and proceeds to the new seek routine in step 206. Otherwise, routine 200 proceeds to step 208 to initially set the stop threshold equal to zero. Thereafter, in step 210, routine 200 increments to the next valid radio frequency, and then proceeds to decision step 212 to check whether the tuner has returned to the start frequency. Once returning to the start frequency, routine 200 proceeds to step 214 to measure the AGC value, and then proceeds to decision step 216 to check if the AGC value is in the top five values of signal strength and, if not, returns to step 210. If the AGC value is in the top five values of signal strength, routine 200 proceeds to step 218 to store the frequency and AGC value in memory, and overrides those values in memory that are not in the top five signal strength values. Thereafter, routine 200 returns to step 210. Once returning to the start frequency, routine 200 proceeds to step 220 to calculate an average AGC value based on the top five values, and then proceeds to step 222 to store the average AGC value as the stop threshold, before proceeding to step 224 to go to the new seek threshold routine. If desired, the average AGC value can be weighted.

Turning to FIGS. 10A and 10B, the new seek threshold routine 230 is illustrated therein. Routine 230 begins at step 232 and proceeds to decision step 234 to determine if at least T minutes have elapsed since the last seek operation and, if not, proceeds to the seek routine in step 236. If T minutes have elapsed, routine 230 proceeds to step 238 to tune to the next frequency, and then measures the AGC value and adds the AGC value to the average value in step 240. The average value is then saved as new stop in step 242. In decision step 244, routine 230 checks for a return to the start frequency and, if the current frequency is not equal to the start frequency, returns back to step 238 to select the next frequency. Once routine 230 returns to the start frequency, step 246 checks to see if the new stop is within predefined limits, such as those set by the factory. If the new stop is not within the predefined limits, routine 230 proceeds to the seek operation routine in step 248. If the new stop is within the predefined limits, routine 230 sets a dB change equal to the absolute dB difference of new stop minus stop threshold, in step 250. In decision step 252, a decision of whether the dB change is less than Z dB is determined. If the dB change is less than Z dB, routine 230 proceeds to the seek routine in step 154. Otherwise, routine 230 proceeds to decision step 256 to check if the new stop is less than the stop threshold. If the new stop is less than the stop threshold, the stop threshold is decreased by the amount of the dB change in step 262. Contrarily, if new stop is not less than the stop threshold, the stop threshold is increased by the amount of the dB change in step 258. Following the increase or decrease in stop threshold, routine 230 proceeds to the seek operation routine, in step 260.

The seek operation routine 270 is illustrated in FIG. 11. The seek operation routine begins at step 270 and proceeds to set the current frequency as the start frequency in step 274. Next, in step 276, the radio tunes to the next frequency, and then proceeds to decision step 278 to determine if the AGC value is greater than the stop threshold and, if so, stops at the frequency in step 282. If the AGC value is not greater than the stop threshold, routine 270 proceeds to step 280 to check for a return to the start frequency and, if not, returns to step 276. Once the channel selection has returned to the start frequency, routine 270 proceeds to step 282 to stop at that frequency. Thereafter, the audio output is unmuted in step 284 prior to proceeding to end the seek operation routine in step 286.

Accordingly, the routines in FIGS. 9–11 advantageously calculate an average AGC value, and adjusts the seek sensitivity threshold based on the average value. The adjustable seek sensitivity threshold is then employed during a radio seek operation. By doing so, the number of radio station channels selected during a seek operation may be more suitable to the user.

While the present invention has been described in connection with an AM/FM audio car radio 12 according to the preferred embodiments, it should be appreciated that the present invention may be applied to other types of radios for receiving various types of information broadcast in various radio band frequencies, without departing from the spirit of the present invention. For example, the radio could be used to automatically tune to NOAA weather band broadcast signals which typically range from 162.400 to 162.550 kHz.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. A tuneable radio having an adjustable seek sensitivity, said radio comprising:
   a radio receiver for receiving broadcast radio wave signals;
   a tuner adjustable for selecting from a plurality of radio wave signal channels;
   a detector for detecting signal strength of said received radio wave signals;
   a seek input for initiating a seek operation to select a radio wave signal channel having a detected signal strength greater than a seek sensitivity threshold;
   a device for determining a signal indicative of vehicle travel; and
   a controller for receiving the detected signal strength of said received radio wave signals and adjusting the seek sensitivity threshold based on said detected signal strength, wherein said controller determines when to adjust said seek sensitivity threshold value based on said signal indicative of vehicle travel.

2. The tuneable radio as defined in claim 1, wherein said device comprises a position indicative receiver for receiving position indicative signals.

3. The tuneable radio as defined in claim 2, wherein said position indicative receiver comprises a global positioning system receiver for receiving global positioning system signals.

4. The tuneable radio as defined in claim 1, wherein said device comprises a timer for detecting a period of time during which the vehicle is driven.

5. The tuneable radio as defined in claim 1, wherein said device comprises an odometer for generating a distance measurement.

6. The tuneable radio as defined in claim 1, wherein said controller adjusts said seek sensitivity threshold when the tuner is in an inactive mode.

7. The tuneable radio as defined in claim 6, wherein said controller adjusts said seek sensitivity threshold when the radio is operating in a playback mode.

8. The tuneable radio as defined in claim 1, wherein said radio is located on a mobile vehicle.

9. The tuneable radio as defined in claim 8, wherein said radio comprises a car radio.

10. A tuneable radio having an adjustable seek sensitivity, said radio comprising:
    a radio receiver for receiving broadcast radio wave signals;
    a tuner adjustable for selecting from a plurality of radio wave signal channels;
    a detector for detecting signal strength of said radio received wave signals;
    a seek input for initiating a seek operation to seek a radio wave signal channel having a detected signal strength greater than a seek sensitivity threshold;
    a device for determining a signal indicative of vehicle travel; and
    a controller for receiving the detected signal strength of said received signals and said signal indicative of vehicle travel, said controller determining a seek sensitivity threshold and adjusting the seek sensitivity threshold when said signal indicative of vehicle travel indicates that the vehicle has travelled in excess of a minimum distance.

11. The tuneable radio as defined in claim 10, wherein said device comprises a position indicative receiver for receiving position indicative signals.

12. The tuneable radio as defined in claim 11, wherein said position indicative receiver comprises a global positioning system receiver for receiving global positioning system signals.

13. The tuneable radio as defined in claim 10, wherein said device comprises a timer for detecting a period of time during which the vehicle is driven.

14. The tuneable radio as defined in claim 10, wherein said device comprises an odometer.

15. The tuneable radio as defined in claim 10, wherein said controller adjusts said seek sensitivity threshold when the tuner is in an inactive mode.

16. The tuneable radio as defined in claim 15, wherein said controller adjusts said seek sensitivity threshold when the radio is operating in a playback mode.

17. The tuneable radio as defined in claim 10, wherein said radio is located on a mobile vehicle.

18. The tuneable radio as defined in claim 17, wherein said radio comprises a car radio.

19. A method for adjusting seek sensitivity on a tuneable radio, said method comprising the steps of:
    receiving broadcast radio wave signals;
    providing a tuner adjustable for selecting from a plurality of radio wave signal channels;
    detecting signal strength for said received radio wave signals;
    determining a signal indicative of vehicle travel; and
    adjusting a seek sensitivity threshold based on said detected signal strength when said signal indicative of vehicle travel indicates that the vehicle has travelled in excess of a minimum distance.

20. The method as defined in claim 19, wherein said step of determining a signal indicative of vehicle travel comprises receiving position indicative signals with a position indicative receiver.

21. The method as defined in claim 20, wherein said step of receiving position indicative signals comprises receiving global positioning system signals with a global positioning system receiver.

22. The method as defined in claim 19 further comprising the step of performing a seek operation by comparing the received signal strength of received signals with said seek sensitivity threshold.

23. The method as defined in claim 19, wherein said step of adjusting the seek sensitivity threshold is performed when the tuner is in an inactive mode.

24. The method as defined in claim 23, wherein said step of adjusting the seek sensitivity threshold is performed when the radio is operating in a playback mode.

25. A method for adjusting seek sensitivity in a tuneable radio, said method comprising the steps of:

receiving broadcast radio wave signals;

providing a tuner adjustable for selecting from a plurality of radio wave signal channels;

detecting signal strength for said received broadcast radio wave signals;

determining a signal indicative of vehicle travel; and adjusting a seek sensitivity threshold when said signal indicative of vehicle travel indicates that the vehicle has travelled in excess of a minimum distance.

26. A method as defined in claim 25, wherein said step of adjusting the seek sensitivity threshold is based on said signal strength.

27. The method as defined in claim 25 further comprising the step of performing a seek operation by comparing the received signal strength of received signals with said seek sensitivity threshold.

28. The method as defined in claim 25, wherein said step of determining a signal indicative of vehicle travel comprises receiving position indicative signals with a position indicative receiver.

29. The method as defined in claim 28, wherein said step of receiving position indicative signals comprises receiving global positioning system signals with a global positioning system receiver.

30. The method as defined in claim 25, wherein said step of adjusting the seek sensitivity threshold is performed when the tuner is in an inactive mode.

31. The method as defined in claim 30, wherein said step of adjusting the seek sensitivity threshold is performed when the radio is operating in a playback mode.

* * * * *